(12) United States Patent
Lee

(10) Patent No.: US 12,059,713 B2
(45) Date of Patent: *Aug. 13, 2024

(54) SUBSTRATE TREATING APPARATUS COMPRISING ULTRASONIC WAVE CLEANING UNIT

(71) Applicant: DEVICEENG CO., LTD., Chungcheongnam-do (KR)

(72) Inventor: Taek Youb Lee, Chungcheongnam-do (KR)

(73) Assignee: DEVICEENG CO., LTD., Asan-si (KR)

( * ) Notice: Subject to any disclaimer, the term of this patent is extended or adjusted under 35 U.S.C. 154(b) by 215 days.

This patent is subject to a terminal disclaimer.

(21) Appl. No.: 17/729,113

(22) Filed: Apr. 26, 2022

(65) Prior Publication Data

US 2023/0264232 A1 Aug. 24, 2023

(30) Foreign Application Priority Data

Feb. 21, 2022 (KR) .................. 10-2022-0022470

(51) Int. Cl.
*B08B 3/12* (2006.01)
*B08B 13/00* (2006.01)

(52) U.S. Cl.
CPC .............. *B08B 3/12* (2013.01); *B08B 13/00* (2013.01)

(58) Field of Classification Search
CPC .. B08B 3/12; B08B 13/00; B08B 3/08; B08B 3/123; H01L 21/67051; H01L 21/68728; H01L 21/6704; H01L 21/67253; H01L 21/6838; H01L 21/68792
See application file for complete search history.

(56) References Cited

U.S. PATENT DOCUMENTS

| 8,714,169 | B2 | 5/2014 | Lee et al. | |
|---|---|---|---|---|
| 2002/0029788 | A1* | 3/2002 | Verhaverbeke | B08B 3/12 134/102.1 |
| 2003/0168946 | A1* | 9/2003 | Beck | H04R 23/00 310/367 |
| 2005/0003737 | A1* | 1/2005 | Montierth | H01L 21/67057 451/5 |
| 2005/0252522 | A1* | 11/2005 | Struven | H01L 21/67057 134/1 |
| 2006/0070641 | A1* | 4/2006 | Kim | B08B 3/12 134/186 |
| 2009/0090381 | A1* | 4/2009 | Li | H01L 21/67051 134/1 |
| 2012/0097195 | A1* | 4/2012 | Wang | B08B 3/12 134/198 |
| 2013/0008462 | A1* | 1/2013 | Beck | H01L 21/67051 134/1.3 |

FOREIGN PATENT DOCUMENTS

KR 20100059549 A * 6/2010

OTHER PUBLICATIONS

Machine translation of KR-20100059549-A (Year: 2010).*

* cited by examiner

*Primary Examiner* — Erin F Bergner
(74) *Attorney, Agent, or Firm* — BLANK ROME LLP

(57) ABSTRACT

The present invention relates to a substrate treatment apparatus including: a chuck base rotatably disposed around a rotating shaft; chuck pins disposed on top of the chuck base to fix a substrate thereto; and an ultrasonic cleaning unit disposed on top of the chuck base to perform ultrasonic cleaning for the underside of the substrate.

8 Claims, 9 Drawing Sheets

SUBSTRATE TREATING APPARATUS COMPRISING ULTRASONIC WAVE CLEANING UNIT

CROSS REFERENCE TO RELATED APPLICATION OF THE INVENTION

The present application claims the benefit of Korean Patent Application No. 10-2022-0022470 filed in the Korean Intellectual Property Office on Feb. 21, 2022, the entire contents of which are incorporated herein by reference.

BACKGROUND OF THE INVENTION

Field of the Invention

The present invention relates to a substrate treatment apparatus having an ultrasonic cleaning unit, and more specifically, to a substrate treatment apparatus having an ultrasonic cleaning unit that is capable of cleaning the underside of a substrate, while rotating the substrate.

Background of the Related Art

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In specific, a treatment liquid is supplied to top and/or underside of the substrate, while a spin head (chuck base) is rotating in a state where the substrate is supported on top of the spin head, thereby performing the cleaning and drying processes.

To prevent the substrate from escaping from the chuck base in a lateral direction of the chuck base during the rotation of the chuck base, generally, a plurality of chuck pins are spaced apart from one another on the chuck base in a circumferential direction of the chuck base.

According to a conventional substrate treatment apparatus, a fluid supply unit is located above the substrate to dispense a cleaning liquid into the surface of the substrate mounted on the rotating chuck base, thereby performing cleaning for the surface of the substrate, and further, a back nozzle assembly is disposed on the chuck base, without any rotation, so that through the back nozzle assembly, a material such as a cleaning liquid, a gas, and the like is dispensed into the underside of the substrate to clean or dry the underside of the substrate.

From the past, cleaning for the surface of the substrate is performed through an ultrasonic cleaning unit, but there is a limitation in ensuring a space for installing the ultrasonic cleaning unit under the underside of the substrate rotating. Additionally, it is hard to provide a structure for supplying a cleaning liquid for performing ultrasonic cleaning. Even though the ultrasonic cleaning unit has excellent cleaning effectiveness, accordingly, it cannot be easily utilized in cleaning the underside of the substrate.

SUMMARY OF THE INVENTION

Accordingly, the present invention has been made in view of the above-mentioned problems occurring in the related art, and it is an object of the present invention to provide a substrate treatment apparatus having an ultrasonic cleaning unit that is capable of cleaning the underside of a substrate through the ultrasonic cleaning unit, while rotating the substrate.

To accomplish the above-mentioned objects, according to the present invention, there is provided a substrate treatment apparatus including: a chuck base rotatably disposed around a rotating shaft; chuck pins disposed on top of the chuck base to fix a substrate thereto; and an ultrasonic cleaning unit disposed on top of the chuck base and under the substrate to perform ultrasonic cleaning for the underside of the substrate.

According to the present invention, desirably, the ultrasonic cleaning unit may include: an ultrasonic cleaning head extending in a radial direction of the substrate around the rotating shaft in a plan view and having an inner cleaning liquid flow path formed on top thereof toward the substrate; an inner cleaning liquid supply tube whose first outlet is connected to the ultrasonic cleaning head to communicate with the inner cleaning liquid flow path; and an outer cleaning liquid supply tube disposed on the outside of the ultrasonic cleaning head and having an second outlet formed toward the substrate.

According to the present invention, desirably, in the radial direction with respect to the center of the substrate, a point toward which the outer cleaning liquid supply tube sprays on the substrate is located further away from a point toward which the inner cleaning liquid flow path sprays on the substrate.

According to the present invention, desirably, the chuck base may have a fluid movement guide tube as a non-rotary part extending up and down along the center thereof to accommodate the inner cleaning liquid supply tube and the outer cleaning liquid supply tube extending up and down therealong.

According to the present invention, desirably, the ultrasonic cleaning unit may include an adapter disposed around the ultrasonic cleaning head near the inner cleaning liquid flow path in a plan view to allow the inner cleaning liquid supply tube to be drawn therefrom and connected to the ultrasonic cleaning head and to allow the outer cleaning liquid supply tube to be drawn therefrom and located toward the underside of the substrate.

According to the present invention, desirably, an discharge port of the inner cleaning liquid flow path may be formed at the transversal center of the ultrasonic cleaning head around the center of the substrate in a plan view, and the inner cleaning liquid flow path may extend slantly toward the underside of the substrate in a radial direction thereof in a side view of the ultrasonic cleaning head.

According to the present invention, desirably, the outer cleaning liquid supply tube may be disposed slantly toward the ultrasonic cleaning head with respect to the radial direction around the rotary shaft in a plan view to thus have a rotational direction component of the chuck base.

According to the present invention, desirably, the ultrasonic cleaning head may become enlarged in width toward the radial direction of the substrate from the rotary shaft and then constant in width from the predetermined portion thereof to the end thereof in a plan view.

According to the present invention, desirably, the ultrasonic cleaning unit may include a pair of plate-shaped vibrators disposed inside the ultrasonic cleaning head in a longitudinal direction of the ultrasonic cleaning head, and the pair of vibrators is open inclined toward each other to allow the open portion to be located toward the substrate in a cross-sectional view.

According to the present invention, desirably, the vibrators may become greater in width toward the peripheral edge of the substrate.

According to the present invention, desirably, the ultrasonic cleaning unit may include a cooling gas tube accommodatedly extending longitudinally in the fluid movement guide tube to communicate with the interior of the ultrasonic cleaning head.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
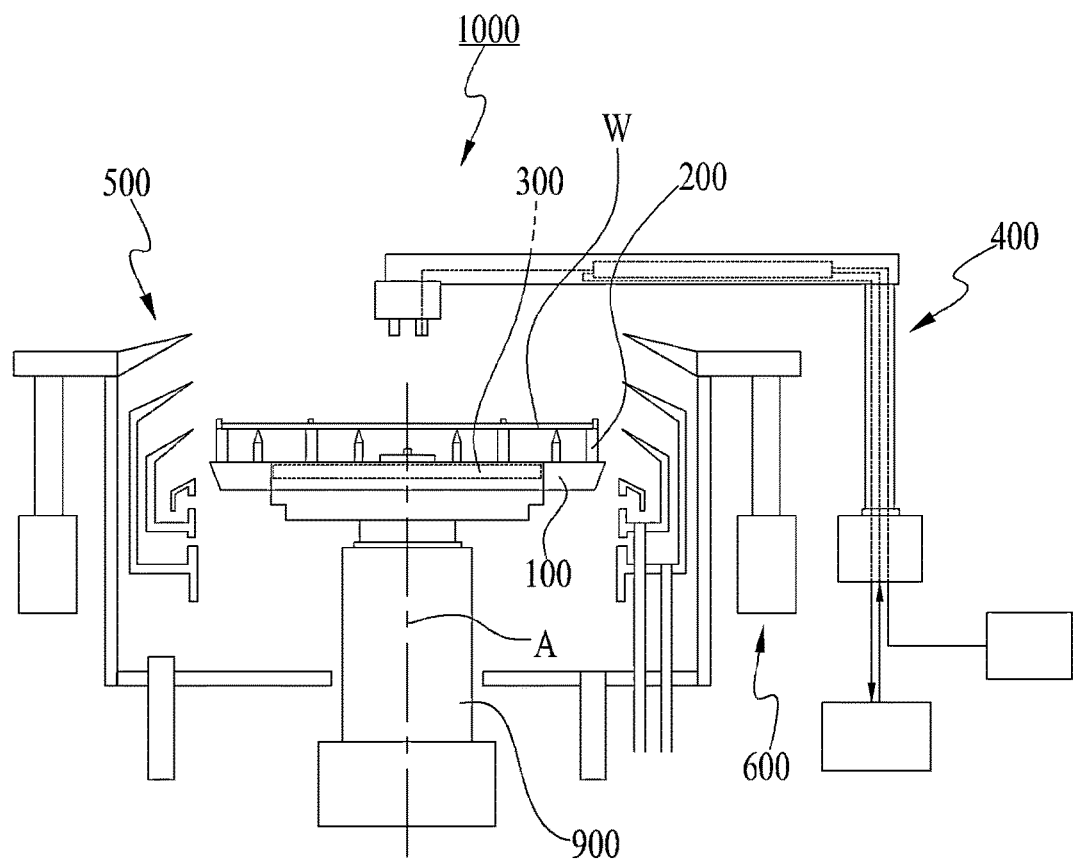
FIG. 1 is a schematic side sectional view showing a substrate treatment apparatus having an ultrasonic cleaning unit according to the present invention.
Figure 2:
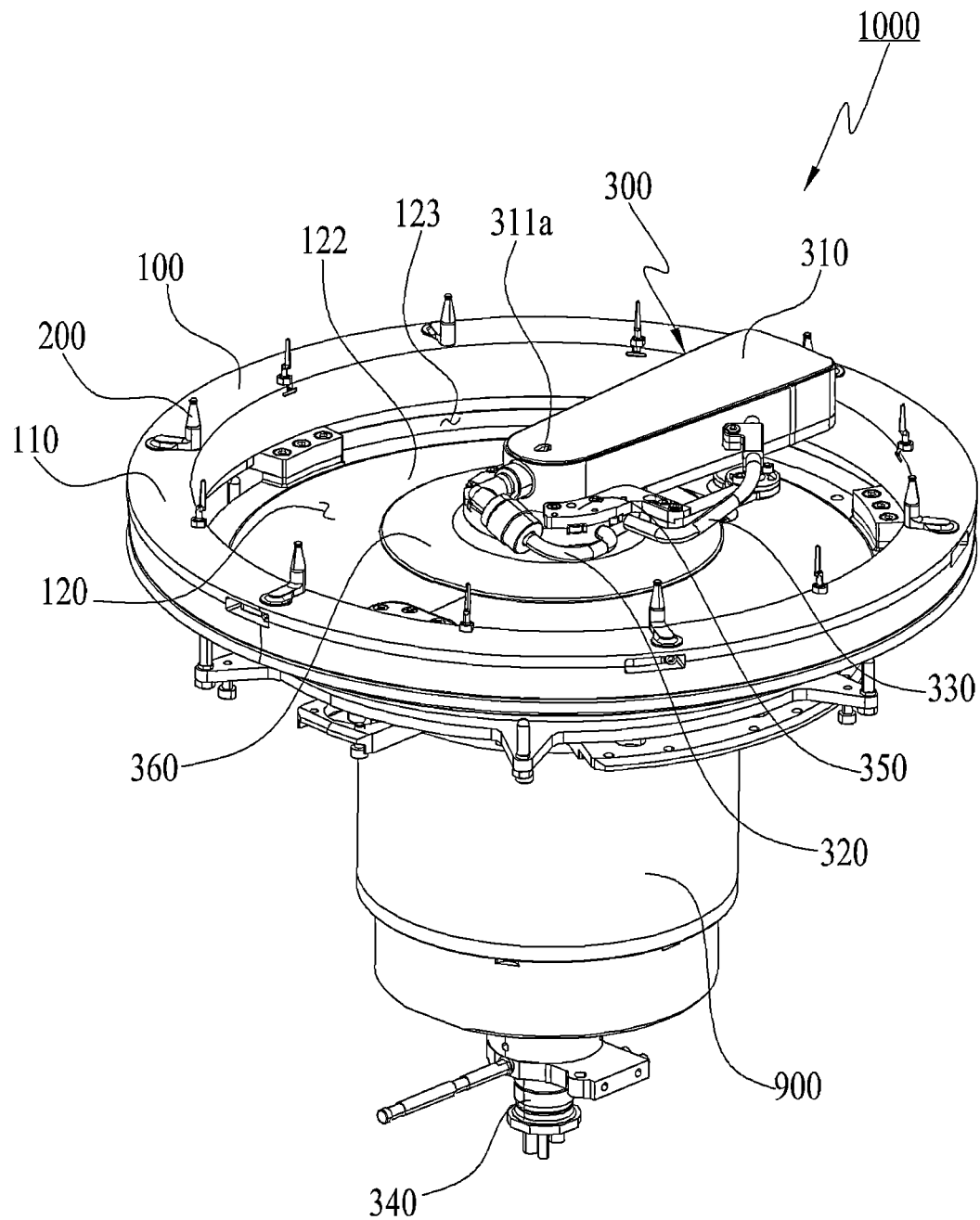
FIG. 2 is a perspective view showing the substrate treatment apparatus having the ultrasonic cleaning unit according to the present invention.

As shown in FIGS. 1 and 2, a substrate treatment apparatus 1000 according to the present invention includes a chuck base 100 rotatably disposed around a rotating shaft A, chuck pins 200 disposed on top of the chuck base 100 to fix a substrate W thereto, a fluid supply unit 400 for supplying a treatment liquid or gas for surface treatment of the substrate W to the substrate W, a bowl assembly 500 for receiving the treatment liquid used for the treatment and fumes generated during the treatment to prevent the treatment liquid and fumes from scattering or flowing to the outside, an ascending and descending unit 600 for moving up and down the chuck base 100 or the bowl assembly 500, and an ultrasonic cleaning unit 300 disposed on top of the chuck base 100 and under the substrate W to perform ultrasonic cleaning for the underside of the substrate W.

The ultrasonic cleaning unit 300 has conduction with vibrators such as piezoelectric vibrators to thus generate vibrations and then transmits the vibrations to the substrate W through a medium such as water, a cleaning liquid, and the like to clean the underside of the substrate W rotating.

Figure 3:
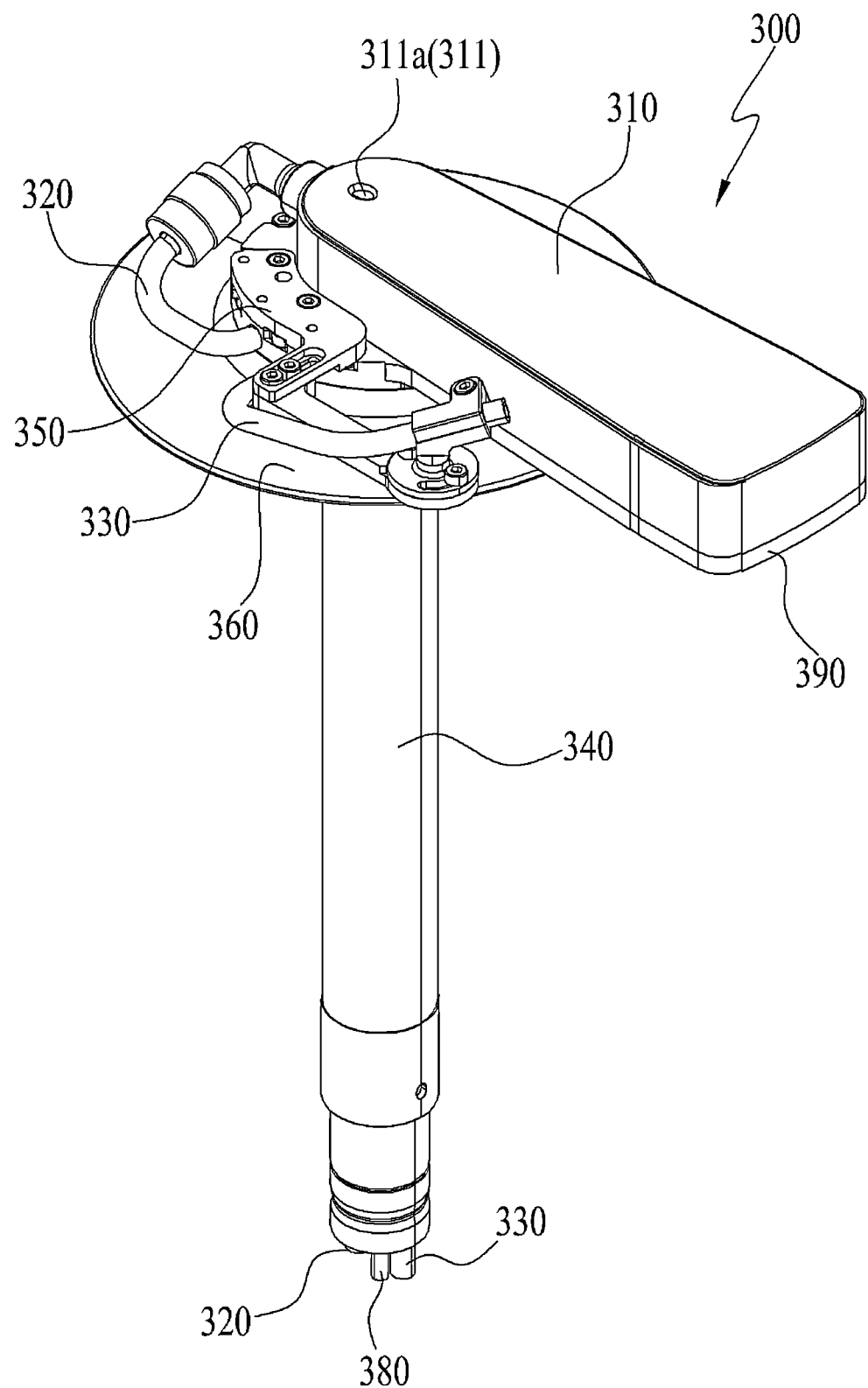
FIG. 3 is a perspective view showing the ultrasonic cleaning unit of FIG. 2.
Figure 4:
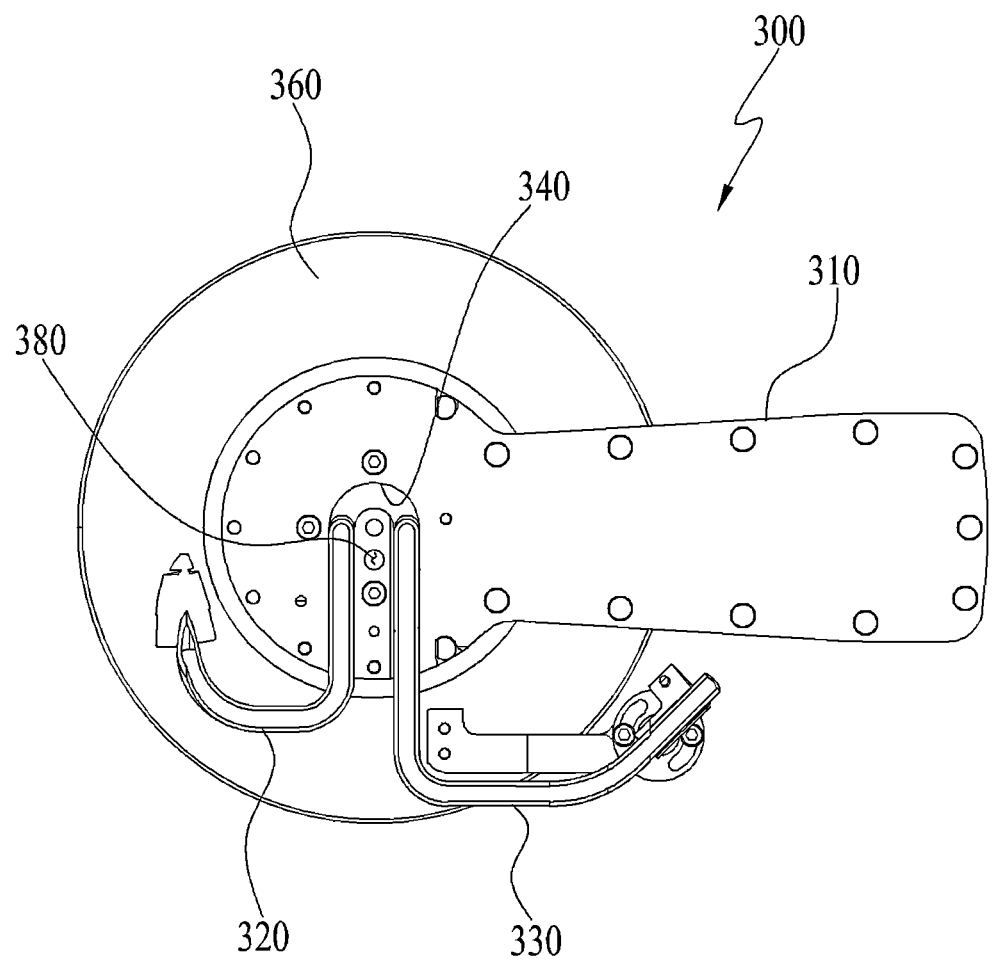
FIG. 4 is a cross-sectional view showing an inner cleaning liquid supply tube and an outer cleaning liquid supply tube of FIG. 3.
Figure 5:
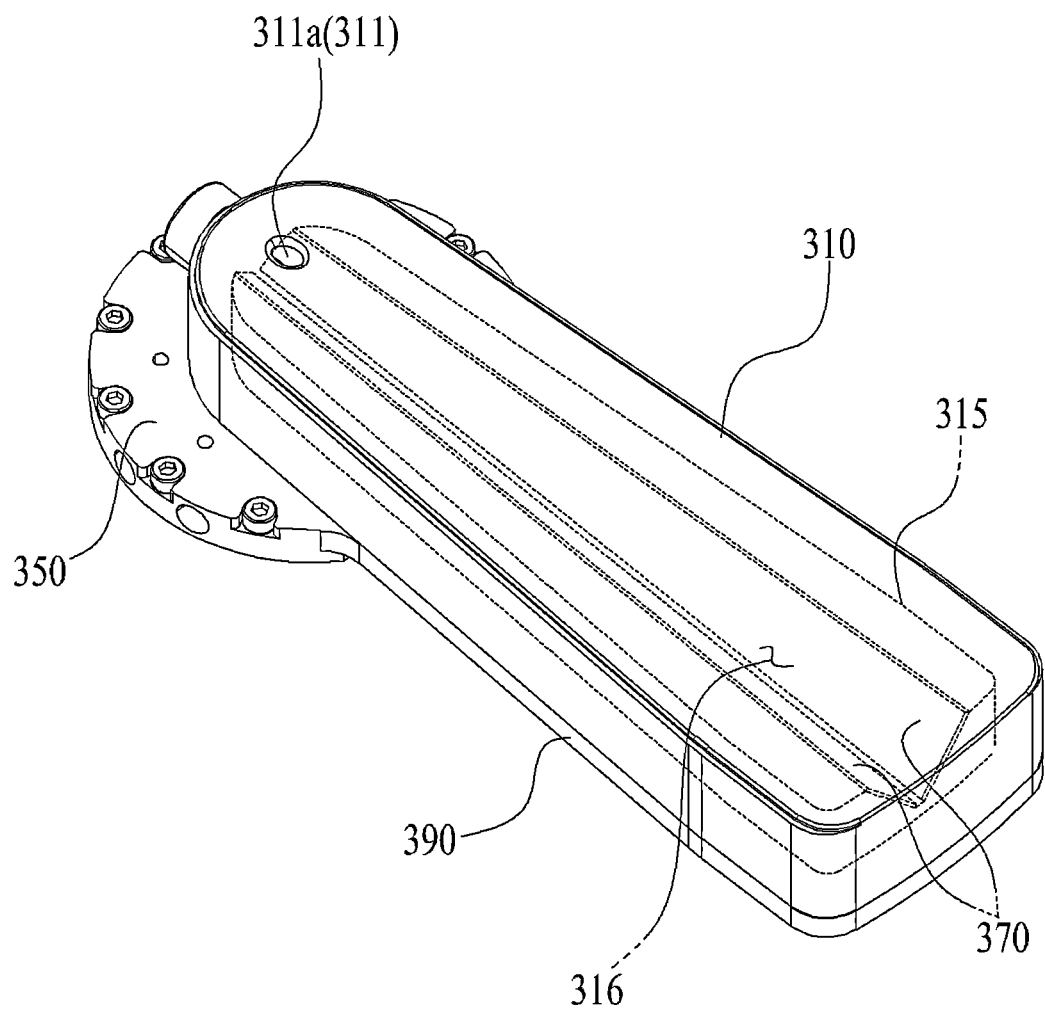
FIG. 5 is a perspective view showing an ultrasonic cleaning head of FIG. 3.
Figure 9:
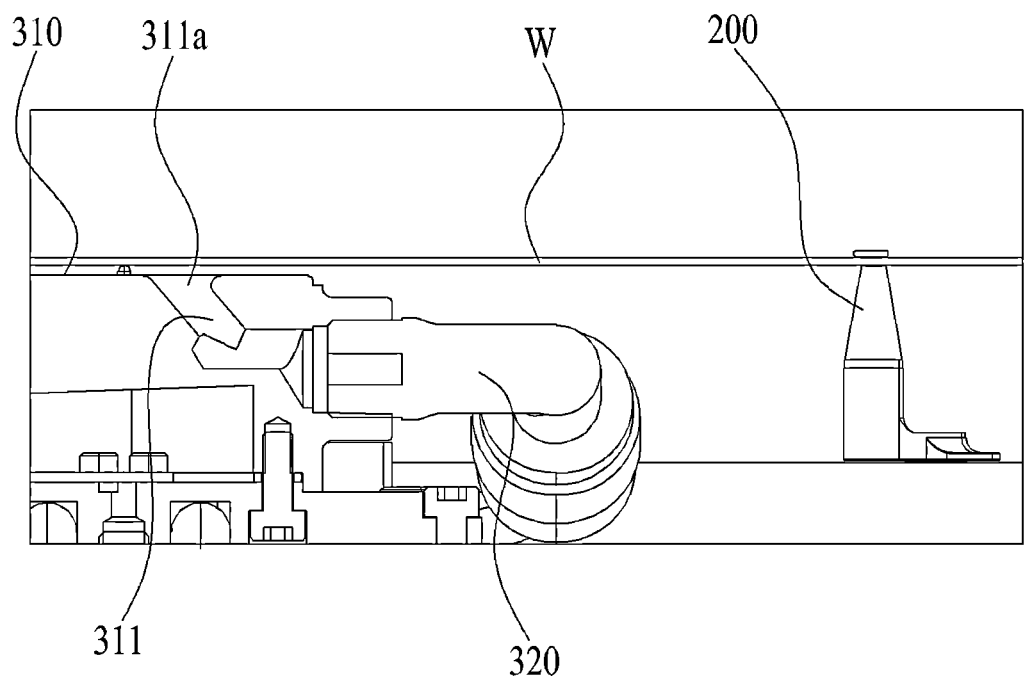
FIG. 9 is a sectional view taken along the line B-B of FIG. 6.

In a plan view, as shown in FIGS. 3, 4 and 9, the ultrasonic cleaning unit 300 includes an ultrasonic cleaning head 310 extending in a radial direction of the substrate W around the rotating shaft A and having an inner cleaning liquid flow path 311 formed therein toward the underside of the substrate W and a discharge port 311a formed on top thereto to communicate with the inner cleaning liquid flow path 311, an inner cleaning liquid supply tube 320 whose first outlet is connected to one longitudinal end of the ultrasonic cleaning head 310 and communicating with the inner cleaning liquid flow path 311, and an outer cleaning liquid supply tube 330 disposed on the outside of the ultrasonic cleaning head 310 and having an second outlet formed toward the underside of the substrate W.

In this case, a point toward which the outer cleaning liquid supply tube 330 sprays on the substrate W in the radial direction of the substrate W is located at a longer distance than a point toward which the discharge port 311a of the inner cleaning liquid flow path 311 sprays on the substrate W.

The inner cleaning liquid flow path 311 is formed inside the ultrasonic cleaning head 310 and has one end connected to the inner cleaning liquid supply tube 320 and the other end exposed to top of the ultrasonic cleaning head 310 to thus form the discharge port 311a. That is, The inner cleaning liquid flow path 311 has an inlet port formed at one longitudinal end of the ultrasonic cleaning head 310 and the discharge port 311a formed on the top of the ultrasonic cleaning head 310 to face toward the substrate W.

The inner cleaning liquid supply tube 320 is connected to one longitudinal end of the ultrasonic cleaning head 310, that is, to the side end of the ultrasonic cleaning head 310 around the center of the substrate W or the rotating shaft A.

The cleaning liquid, which is supplied from the inner cleaning liquid supply tube 320 and the outer cleaning liquid supply tube 330, respectively, is filled in a space between the substrate W and top of the ultrasonic cleaning head 310 to transmit ultrasonic vibrations to the substrate W.

Under the above-mentioned configuration, the cleaning liquid, which is dispensed from the inner cleaning liquid flow path 311 through the inner cleaning liquid supply tube 320, is applied to a region around the center C of the substrate W, and the cleaning liquid, which is dispensed from the outer cleaning liquid supply tube 330, is applied to a region including a peripheral edge of the substrate W from the center C thereof. As a result, the cleaning liquid is applied to the entire surface of the substrate W, thereby achieving perfect cleaning for the substrate W.

That is, the cleaning liquid dispensed from the outer cleaning liquid supply tube 330 is added to the cleaning liquid dispensed from the inner cleaning liquid flow path 311, so that the flow energy of the cleaning liquid is enhanced to allow the entire radial surface of the substrate W to be covered with the cleaning liquid.

If the cleaning liquid is dispensed from both of the inner cleaning liquid flow path 311 and the outer cleaning liquid supply tube 330, an area where the dispensed cleaning liquids are overlaid onto each other may be generated, but cleaning effectiveness may not become poor by the overlaid area.

The chuck base 100 as a rotary part has a fluid movement guide tube 340 as a non-rotary part extending up and down along the center thereof, and the inner cleaning liquid supply tube 320 and the outer cleaning liquid supply tube 330, which are separated each other, are accommodated in the fluid movement guide tube 340 to extend up and down therealong, so that they can supply the cleaning liquid easily and gently.

As shown in FIGS. 2 to 7, the ultrasonic cleaning unit 300 further includes an adapter 350 disposed around the ultrasonic cleaning head 310 near the inner cleaning liquid flow path 311 in a plan view to allow the inner cleaning liquid supply tube 320 to be drawn therefrom and connected to the ultrasonic cleaning head 310 and to allow the outer cleaning liquid supply tube 330 to be drawn therefrom and located toward the underside of the substrate W, so that through the adapter 350, desirably, the inner cleaning liquid supply tube 320 and the outer cleaning liquid supply tube 330 can be mounted without any movement.

The adapter 350 is separatedly located on the center of the chuck base 100 as the rotary part and fixed to a circular plate 360 constituting the non-rotary part.

Further, as shown, the adapter 350 extends unitarily from a bottom 390 as a portion of the ultrasonic cleaning head 310.

Of course, the adapter 350 may be separately coupled to the ultrasonic cleaning head 310.

Figure 6:
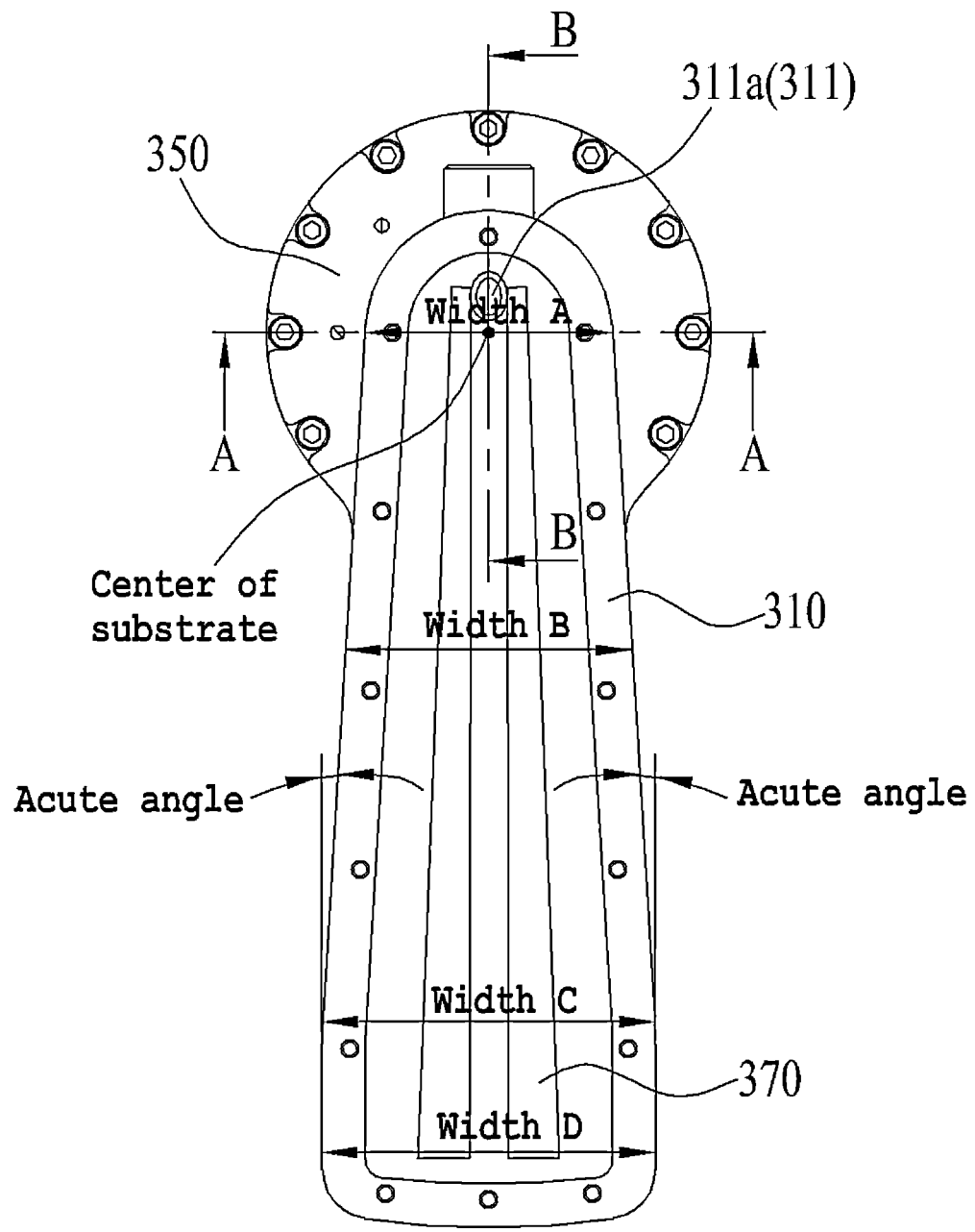
FIG. 6 is a planar sectional view showing the ultrasonic cleaning head according to the present invention.
Figure 7:
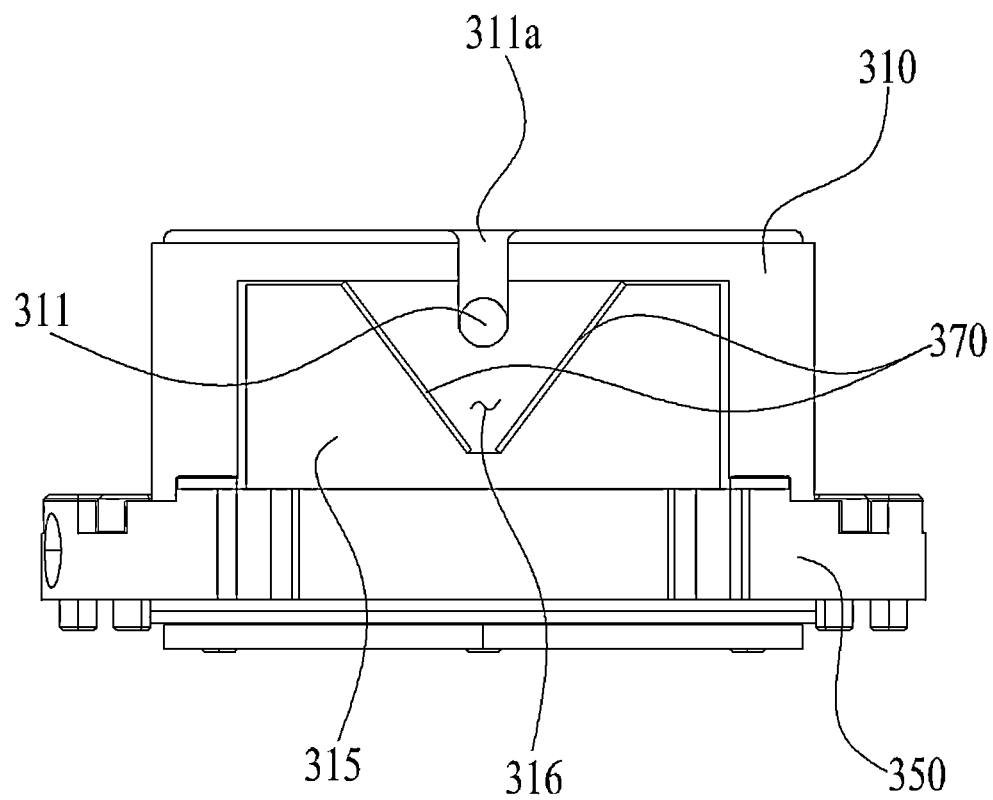
FIG. 7 is a sectional view taken along the line A-A of FIG. 6.

As shown in FIGS. 6 and 9, in a plan view, the inner cleaning liquid flow path 311 is formed at the transversal center of the ultrasonic cleaning head 310 around the center of the substrate W, and in a side view of the ultrasonic cleaning head 310, the inner cleaning liquid flow path 311 extends slantly toward the underside of the substrate W in a radial direction thereof, so that the cleaning liquid is y extendedly dispensed radially around the center of the substrate W.

Further, the discharge port 311a of the inner cleaning liquid flow path 311 is formed on top of the ultrasonic cleaning head 310, and the inner cleaning liquid flow path 311 is formed slantly toward the substrate W. In a plan view, if at least one of both radial ends of the discharge port 311a of the inner cleaning liquid flow path 311 exposed to top of the ultrasonic cleaning unit 300 toward the substrate W is located on the opposite side direction to the center of the rotating shaft A or the center of the substrate W in a radial direction, a dispensing start point from the discharge port 311a of the inner cleaning liquid flow path 311 inside the ultrasonic cleaning unit 300 is located behind the center of the rotating shaft A or the center of the substrate W with respect to a dispensing direction, thereby performing the perfect cleaning for the substrate W.

Further, as shown in FIGS. 2 and 3, the outer cleaning liquid supply tube 330 is disposed slantly toward the ultrasonic cleaning head 310 with respect to the radial direction around the rotary shaft A in a plan view to thus have a rotational direction component of the chuck base 100, so that the outer cleaning liquid supply tube 330 has a rotational direction component of the substrate W.

As the substrate W rotates, accordingly, the cleaning liquid dispensed to the underside of the substrate W is applied to top of the ultrasonic cleaning head 310 to form a thin film, and through the cleaning liquid, ultrasonic vibrations are transmitted to allow the peripheral edge of the substrate W to be easily cleaned.

That is, the cleaning liquid is applied to the center of the substrate W in the radial direction of the substrate W by means of the inner cleaning liquid supply tube 320, and the cleaning liquid is applied even to the peripheral edge of the substrate W in the radial and rotational directions of the substrate W by means of the outer cleaning liquid supply tube 330, so that the cleaning liquid can be dispensed more uniformly and effectively to the entire region of the substrate W.

In a plan view, as shown in FIG. 6, the ultrasonic cleaning head 310 becomes enlarged in width toward the radial direction of the substrate W from the rotary shaft A, that is, toward a longitudinal edge thereof and then constant in width from the predetermined portion thereof to the end thereof.

For example, a portion from a width A to a width C of the ultrasonic cleaning head 310 becomes linearly enlarged, and then, a portion from a width C to a width D thereof becomes constant.

Accordingly, an area occupied by the ultrasonic cleaning head 310 on a bottom 122 of a receiving recess 120 formed on the chuck base 100 can be minimized.

When the substrate W is equally segmented radially around the rotating shaft A, in specific, an area to be treated becomes increased toward the peripheral edge of the substrate, and accordingly, the width of the ultrasonic cleaning head 310 becomes enlarged radially to uniformly transmit a sound pressure per unit area to the substrate W.

Further, as shown in FIGS. 5 to 8, the ultrasonic cleaning unit 300 includes a pair of plate-shaped vibrators 370 disposed inside the ultrasonic cleaning head 310 in a longitudinal direction of the ultrasonic cleaning head 310, and in a cross-sectional view, the pair of vibrators 370 is open inclined toward each other to allow the open portion to be located toward the substrate W.

Under the above-mentioned configuration, if an electrical output is applied to the pair of vibrators 370, sound pressures are overlaidly produced from the vibrators 370 to thus generate high outputs and uniform waveforms, so that the uniform cleaning for the substrate W can be performed.

Desirably, an open angle between the pair of vibrators 370 is an acute angle.

If only a single vibrator 370 is located, the waveforms of the sound pressure become irregular to cause crests and troughs to be seriously generated, so that uniform vibrations cannot be obtained to thus fail to perform uniform cleaning.

Figure 8:
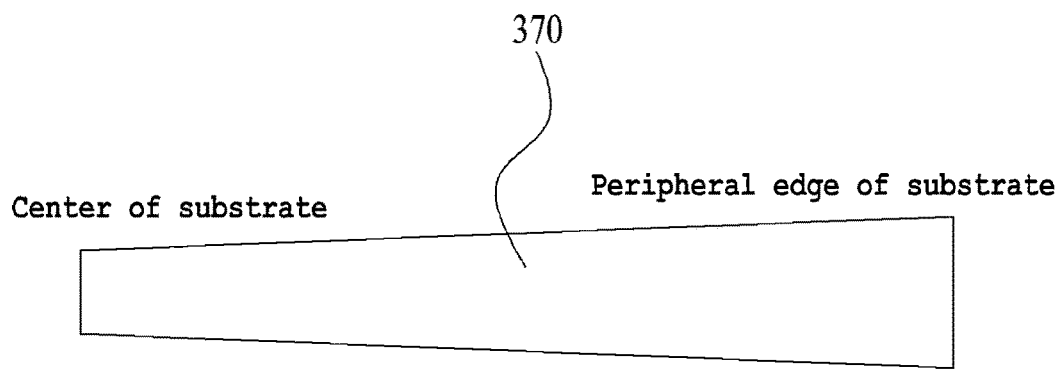
FIG. 8 is a side view showing a vibrator of FIG. 5.

In specific, as shown in FIG. 8, each vibrator 370 becomes enlarged toward the peripheral edge of the substrate W, that is, in a radial direction of the substrate W, and accordingly, the peripheral edge of the substrate W where an area to be treated is relatively large can be easily cleaned, thereby making it possible to uniformly clean the entire underside of the substrate W.

Under the above-mentioned configuration, if an electric current flows to the plated-shaped vibrators 370 such as piezoelectric vibrators, vibrations are generated from the vibrators 370, and they are transmitted to the quartz constituting the ultrasonic cleaning head 310. Next, the ultrasonic vibrations are transmitted to the cleaning liquid (for example, water) filled in the space between the ultrasonic cleaning head 310 and the substrate W to thus perform the ultrasonic cleaning for the substrate W.

Further, the ultrasonic cleaning head 310 has a support body 315 disposed at the inner space thereof to support the pair of vibrators 370, and the support body 315 has a support groove 316 formed on top thereof to have a cross-sectional area with an acute angle.

Further, as shown in FIGS. 3 and 4, a cooling gas tube 380 is accommodated and extended longitudinally in the fluid movement guide tube 340 and passes through the bottom of the ultrasonic cleaning head 310 to communicate with the interior of the ultrasonic cleaning head 310, and accordingly, the cooling gas tube 380 supplies a nitrogen gas N2 to the interior of the ultrasonic cleaning head 310 and cools the heat generated from the vibrators 370, thereby preventing the vibrators 370 from being excessively deformed due to the heat.

Further, as shown in FIG. 2, the receiving recess 120 is formed on top of the chuck base 100 to accommodate the ultrasonic cleaning unit 300.

In this case, a chemical liquid such as a cleaning liquid, a drying liquid, and the like to be supplied to the surface or underside of the substrate W is introduced into the receiving recess 120, and so as to prevent the chemical liquid from being accumulated in the receiving recess 120, in this case, a drain hole 123 is piercedly formed on the bottom 122 of the receiving recess 120 or the side peripheral wall of the chuck base 100 to thus allow the chemical liquid to be discharged to the outside or circulated.

If the drain hole 123 is piercedly formed on the bottom 122 of the receiving recess 120 of the chuck base 100, the drain hole 123 is formed close to the inner peripheral edge of an accommodation portion 110 for installation of the chuck pins 200, so that the chemical liquid introduced into the receiving recess 120 can be rapidly discharged. During the rotation of the chuck base 100, further, the centrifugal force generated from the rotation allows the chemical liquid to easily move to the drain hole 123 formed on the bottom 122 of the receiving recess 120, so that the chemical liquid can be discharged to the outside.

A reference numeral 900 not explained yet represents a motor for rotating the chuck base 100.

As described above, the substrate treatment apparatus according to the present invention is configured to have the chuck base rotatably disposed around the rotating shaft, the chuck pins disposed on top of the chuck base to fix the substrate thereto, and the ultrasonic cleaning unit disposed on top of the chuck base and under the substrate to perform the ultrasonic cleaning for the underside of the substrate, whereby the underside of the substrate can be uniformly cleaned by means of the ultrasonic waves.

According to the present invention, further, the ultrasonic cleaning unit includes the ultrasonic cleaning head extending in the radial direction of the substrate around the rotating shaft in a plan view and having the inner cleaning liquid flow path formed on top thereof toward the substrate, the inner cleaning liquid supply tube whose first outlet is connected to the ultrasonic cleaning head to communicate with the inner cleaning liquid flow path, and the outer cleaning liquid supply tube disposed on the outside of the ultrasonic cleaning head and having a second outlet formed toward the substrate, whereby the cleaning liquid, which is dispensed from the inner cleaning liquid flow path through the inner cleaning liquid supply tube, is applied to near the center of the substrate, and the cleaning liquid, which is dispensed from the outer cleaning liquid supply tube, is applied to near the peripheral edge of the substrate, thereby allowing the entire surface of the substrate to be perfectly cleaned.

According to the present invention, moreover, the chuck base has the fluid movement guide tube as the non-rotary part extending up and down along the center thereof to accommodate the inner cleaning liquid supply tube and the outer cleaning liquid supply tube extending up and down therealong, thereby easily and gently supplying the cleaning liquid.

According to the present invention, in addition, the ultrasonic cleaning unit includes the adapter disposed around the inner cleaning liquid flow path of the ultrasonic cleaning head in a plan view to allow the inner cleaning liquid supply tube to be drawn therefrom and connected to the ultrasonic cleaning head and to allow the outer cleaning liquid supply tube to be drawn therefrom and located toward the underside of the substrate, whereby the inner cleaning liquid supply tube and the outer cleaning liquid supply tube can be mounted without any movement.

According to the present invention, also, the discharge port of the inner cleaning liquid flow path is formed at the transversal center of the ultrasonic cleaning head around the center of the substrate in a plan view, and the inner cleaning liquid flow path extends slantly toward the underside of the substrate in a radial direction thereof in a side view of the ultrasonic cleaning head, whereby the dispensed cleaning liquid can be easily extendedly moved radially from the center of the substrate.

According to the present invention, further, the outer cleaning liquid supply tube is disposed slantly toward the ultrasonic cleaning head with respect to the radial direction around the rotary shaft in a plan view to thus have the rotational direction component of the chuck base, so that as the substrate rotates, the cleaning liquid dispensed to the underside of the substrate is applied to top of the ultrasonic cleaning head to form the thin film, and the peripheral edge of the substrate is easily cleaned by means of the ultrasonic waves.

According to the present invention, moreover, the ultrasonic cleaning head becomes enlarged in width toward the radial direction of the substrate from the rotary shaft and then constant in width from the predetermined portion thereof to the end thereof in a plan view, thereby minimizing the area occupied by the ultrasonic cleaning head on the bottom of the receiving recess formed on the chuck base.

According to the present invention, further, the ultrasonic cleaning unit includes the pair of plate-shaped vibrators disposed inside the ultrasonic cleaning head in a longitudinal direction of the ultrasonic cleaning head, and the pair of vibrators is open inclined toward each other to allow the open portion to be located toward the substrate in a cross-sectional view, whereby if the electrical output is applied to the pair of vibrators, the sound pressures are overlaidly produced from the vibrators to thus generate high outputs and uniform waveforms, thereby performing uniform cleaning for the substrate.

According to the present invention, additionally, the vibrators become greater in width toward the peripheral edge of the substrate, so that the peripheral edge of the substrate where an area to be treated is relatively large can be easily cleaned, thereby making it possible to uniformly clean the entire underside of the substrate.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate treatment apparatus comprising:
   a chuck base rotatably disposed around a rotating shaft;
   chuck pins disposed on top of the chuck base to fix a substrate thereto; and
   an ultrasonic cleaning unit disposed on top of the chuck base and under the substrate to perform ultrasonic cleaning for the underside of the substrate,
   wherein the ultrasonic cleaning unit comprises:
   an ultrasonic cleaning head extending in a radial direction of the substrate around the rotating shaft in a plan view, the ultrasonic cleaning head comprising an inner cleaning liquid flow path therein, and the inner cleaning liquid flow path having an inlet port formed at one longitudinal end of the ultrasonic cleaning head and a discharge port formed on top of the ultrasonic cleaning head to face toward the substrate;

an inner cleaning liquid supply tube whose first outlet is connected to the one longitudinal end of the ultrasonic cleaning head to communicate with the inner cleaning liquid flow path; and an outer cleaning liquid supply tube disposed on the outside of the ultrasonic cleaning head and having a second outlet formed toward the substrate, wherein, with respect to the center of the substrate, a point toward which the outer cleaning liquid supply tube sprays on the substrate is located further away from a point toward which the inner cleaning liquid flow path sprays on the substrate, wherein the chuck base has a fluid movement guide tube as a non-rotary part extending up and down along the center thereof to accommodate the inner cleaning liquid supply tube and the outer cleaning liquid supply tube, which are separated from each other and extend up and down therealong.

2. The substrate treatment apparatus according to claim 1, wherein the ultrasonic cleaning unit comprises an adapter disposed around the ultrasonic cleaning head near the inner cleaning liquid flow path in a plan view to allow the inner cleaning liquid supply tube to be drawn therefrom and connected to the ultrasonic cleaning head and to allow the outer cleaning liquid supply tube to be drawn therefrom and located toward the underside of the substrate.

3. The substrate treatment apparatus according to claim 1, wherein the discharge port of the inner cleaning liquid flow path is formed at the transversal center of the ultrasonic cleaning head around the center of the substrate in a plan view, and the inner cleaning liquid flow path extends slantly toward the underside of the substrate in a radial direction thereof in a side view of the ultrasonic cleaning head.

4. The substrate treatment apparatus according to claim 1, wherein the outer cleaning liquid supply tube is disposed slantly toward the ultrasonic cleaning head with respect to the radial direction around the rotary shaft in a plan view to thus have a rotational direction component of the chuck base.

5. The substrate treatment apparatus according to claim 1, wherein the ultrasonic cleaning head becomes enlarged in width toward the radial direction of the substrate from the rotary shaft and then constant in width from the predetermined portion thereof to the end thereof in a plan view.

6. The substrate treatment apparatus according to claim 1, wherein the ultrasonic cleaning unit comprises a pair of plate-shaped vibrators disposed inside the ultrasonic cleaning head in a longitudinal direction of the ultrasonic cleaning head, and in a cross-sectional view, the pair of vibrators is open inclined toward each other to allow the open portion to be located toward the substrate.

7. The substrate treatment apparatus according to claim 6, wherein the vibrators become greater in width toward the peripheral edge of the substrate.

8. The substrate treatment apparatus according to claim 1, wherein the ultrasonic cleaning unit comprises a cooling gas tube accommodatedly extending longitudinally in the fluid movement guide tube to communicate with the interior of the ultrasonic cleaning head.

\* \* \* \* \*